US011380596B2

(12) United States Patent
Ebiike et al.

(10) Patent No.: US 11,380,596 B2
(45) Date of Patent: Jul. 5, 2022

(54) SEMICONDUCTOR TEST APPARATUS, SEMICONDUCTOR DEVICE TEST METHOD, AND SEMICONDUCTOR DEVICE MANUFACTURING METHOD (71) Applicant: Mitsubishi Electric Corporation, Tokyo (JP)

(72) Inventors: Yuji Ebiike, Tokyo (JP); Takaya Noguchi, Tokyo (JP); Yoshinori Ito, Tokyo (JP); Yoshikazu Ikuta, Tokyo (JP); Koichi Takayama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 23 days.

(21) Appl. No.: 16/844,183

(22) Filed: Apr. 9, 2020

(65) Prior Publication Data
US 2021/0098314 A1 Apr. 1, 2021

(30) Foreign Application Priority Data
Sep. 30, 2019 (JP) .............................. JP2019-179446

(51) Int. Cl.
*H01L 21/66* (2006.01)
*G01R 31/26* (2020.01)

(52) U.S. Cl.
CPC .......... *H01L 22/34* (2013.01); *G01R 31/2601* (2013.01); *G01R 31/2621* (2013.01); *H01L 22/14* (2013.01); *H01L 22/20* (2013.01); *H01L 22/22* (2013.01)

(58) Field of Classification Search
CPC ......... H01L 22/34; H01L 22/20; H01L 22/14; H01L 22/22; G01R 31/2601; G01R 31/2621
See application file for complete search history.

(56) References Cited

U.S. PATENT DOCUMENTS

| 11,022,654 B1* | 6/2021 | Wang ................. G01R 31/2879 |
| 2019/0064251 A1 | 2/2019 | Yoshida |

FOREIGN PATENT DOCUMENTS

| CN | 112526312 A | * | 3/2021 | ......... G01R 31/2601 |
| JP | 2019-046907 A | | 3/2019 | |
| JP | 2019046907 A | * | 3/2019 | ......... G01R 31/2875 |

* cited by examiner

*Primary Examiner* — Aaron J Gray
(74) *Attorney, Agent, or Firm* — Studebaker & Brackett PC (57) ABSTRACT A semiconductor test apparatus includes: a power supply; a high-voltage wire connecting high-voltage terminals of a plurality of semiconductor devices which are objects to be tested to a high-voltage side of the power supply; a low-voltage wire connecting low-voltage terminals of the semiconductor devices to a low-voltage side of the power supply; first switches connected in series to the semiconductor devices respectively, each of the first switches having one end connected to the low-voltage side of the power supply via the low-voltage wire and other end connected to the low-voltage terminal; second switches connected to the semiconductor devices respectively, each of the second switches having one end connected to the high-voltage terminal and other end connected to the low-voltage terminal; and a control circuit controlling the first switches and the second switches.

10 Claims, 8 Drawing Sheets

SEMICONDUCTOR TEST APPARATUS, SEMICONDUCTOR DEVICE TEST METHOD, AND SEMICONDUCTOR DEVICE MANUFACTURING METHOD

BACKGROUND OF THE INVENTION

Field

The present disclosure relates to a semiconductor test apparatus that tests a semiconductor device, a semiconductor device test method using the semiconductor test apparatus, and a semiconductor device manufacturing method.

Background

In a manufacturing process for a semiconductor device, for example, elements including a large number of crystal defects and having relatively short life are sorted as defective products by performing a burn-in test for applying loads such as temperature and voltage. This makes it possible to secure reliability of the semiconductor device. In particular, a semiconductor device mainly made of silicon carbide (SiC) has more crystal defects compared with a semiconductor device mainly made of silicon (Si). Therefore, the sorting by the burn-in test is important.

A problem of such a burn-in test is that a test time is long. Related art discloses a semiconductor test apparatus that can perform the burn-in test by simultaneously applying voltage to a plurality of semiconductor devices formed on a semiconductor wafer (see, for example, JP 2019-046907 A).

SUMMARY

However, in the conventional semiconductor test apparatus, if a deficiency such as a leak current equal to or larger than a reference value occurs in a part of the plurality of semiconductor devices to which the voltage is simultaneously applied, a test circuit is short-circuited by the semiconductor device when the voltage application is continued thereafter. There is a problem that the test cannot be continued for the other semiconductor devices having good device characteristics.

The present disclosure has been made to solve the problems described above, and an object of the present disclosure is to obtain a semiconductor test apparatus that can simultaneously test a plurality of semiconductor devices and, even if a deficiency occurs in a part of the semiconductor devices, can continue to test the other semiconductor devices having good device characteristics.

A semiconductor test apparatus according to the present disclosure includes: a power supply; a high-voltage wire connecting high-voltage terminals of a plurality of semiconductor devices which are objects to be tested to a high-voltage side of the power supply; a low-voltage wire connecting low-voltage terminals of the semiconductor devices to a low-voltage side of the power supply; first switches connected in series to the semiconductor devices respectively, each of the first switches having one end connected to the low-voltage side of the power supply via the low-voltage wire and other end connected to the low-voltage terminal; second switches connected to the semiconductor devices respectively, each of the second switches having one end connected to the high-voltage terminal and other end connected to the low-voltage terminal; and a control circuit controlling the first switches and the second switches.

A semiconductor device test method according to the present disclosure includes: electrically connecting high-voltage terminals of a plurality of semiconductor devices to a high-voltage side of a power supply; electrically connecting low-voltage terminals of the semiconductor devices to a low-voltage side of the power supply; starting to simultaneously apply voltage to the plurality of semiconductor devices to detect leak currents; and determining the semiconductor device in which the leak current equal to or larger than a reference value is detected as a defective semiconductor device, disconnecting the defective semiconductor device from the low-voltage side of the power supply and thereafter raising potential of the low-voltage terminal of the defective semiconductor device to potential of the high-voltage terminal.

A semiconductor device manufacturing method according to the present disclosure includes: forming a drift layer on a front surface of a substrate; selectively forming a well region on the drift layer; selectively forming a source region on a surface layer section of the well region; forming a gate insulating film on front surface sides of the drift layer, the well region and the source region; forming a gate electrode on the gate insulating film; forming a source electrode on the source region; forming a drain electrode on a rear surface of the substrate; placing a semiconductor wafer, on which a plurality of semiconductor devices are formed by the above steps, on a wafer stage such that a lower surface side of the semiconductor wafer comes into contact with the wafer stage and electrically connecting the drain electrode to a high-voltage side of a power supply; bringing a probe into contact with an upper surface side of the semiconductor wafer and electrically connecting the source electrode to a low-voltage side of the power supply; starting to simultaneously apply voltage to the plurality of semiconductor devices to detect leak currents; determining the semiconductor device in which the leak current equal to or larger than a reference value is detected as a defective semiconductor device, disconnecting the defective semiconductor device from the low-voltage side of the power supply and thereafter raising potential of the source electrode of the defective semiconductor device to potential of the drain electrode; marking the semiconductor device determined as a defective product; dicing the semiconductor devices formed on the semiconductor wafer; and sorting the diced semiconductor devices into non-defective products and defective products.

In the semiconductor test apparatus according to the present disclosure, first switches are connected in series to a plurality of semiconductor devices which are objects to be tested respectively, each of the first switches has one end connected to a low-voltage side of a power supply and other end connected to a low-voltage terminal of the semiconductor device, second switches are connected to the semiconductor devices respectively, and each of the second switches has one end connected to a high-voltage terminal of the semiconductor device and other end connected to the low-voltage terminal. Therefore, even if some semiconductor devices are defective when the plurality of semiconductor devices are simultaneously tested, it is possible to continue the test without affecting the other semiconductor devices.

Other and further objects, features and advantages of the present disclosure will appear more fully from the following description.

DESCRIPTION OF EMBODIMENTS

Embodiments are explained below with reference to the drawings. In the drawings referred to below, same or equivalent portions are denoted by the same reference numerals and signs and explanation of the portions is not repeated.

First Embodiment

Figure 1:
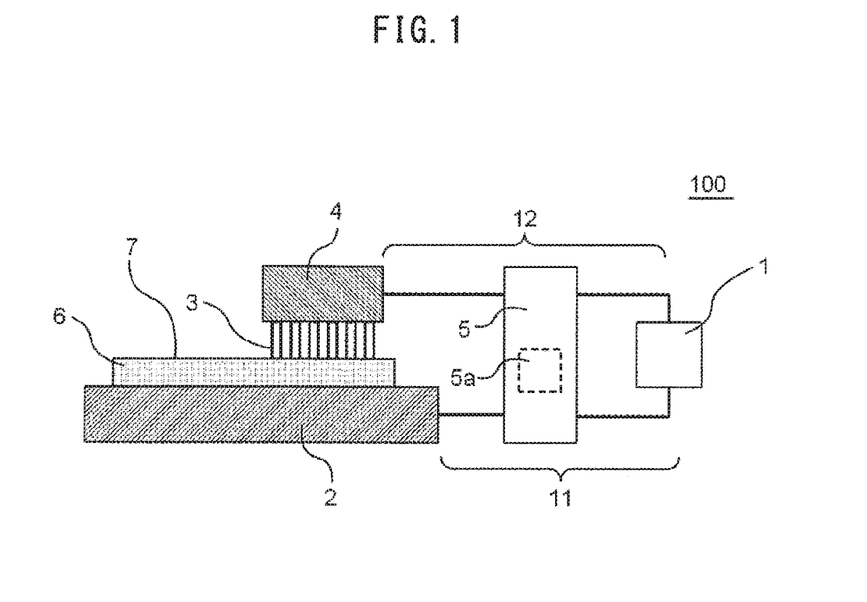
FIG. 1 is a schematic diagram illustrating a semiconductor test apparatus according to a first embodiment.
Figure 2:
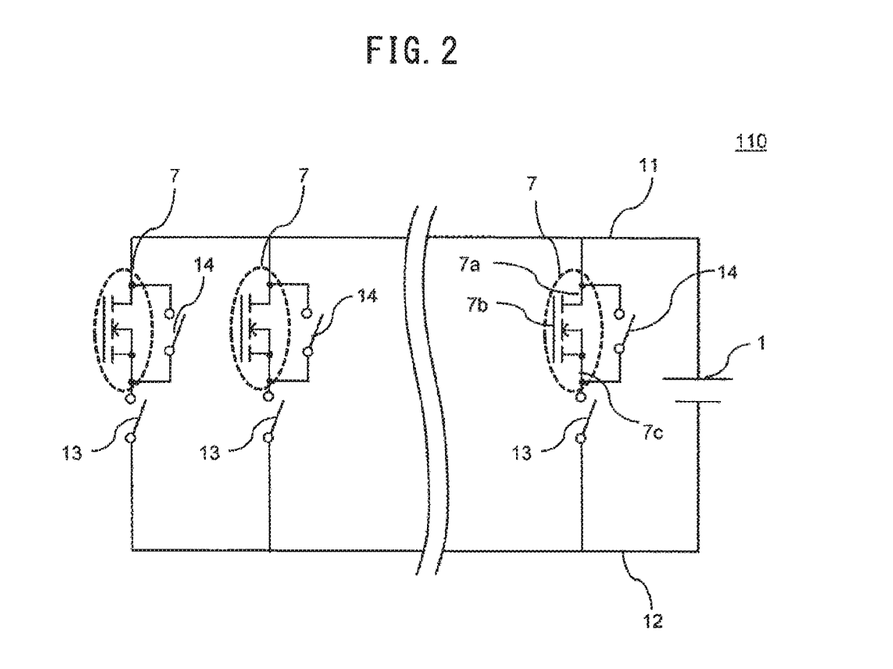
FIG. 2 is a circuit diagram illustrating a test circuit of the semiconductor test apparatus according to a first embodiment.
Figure 3:
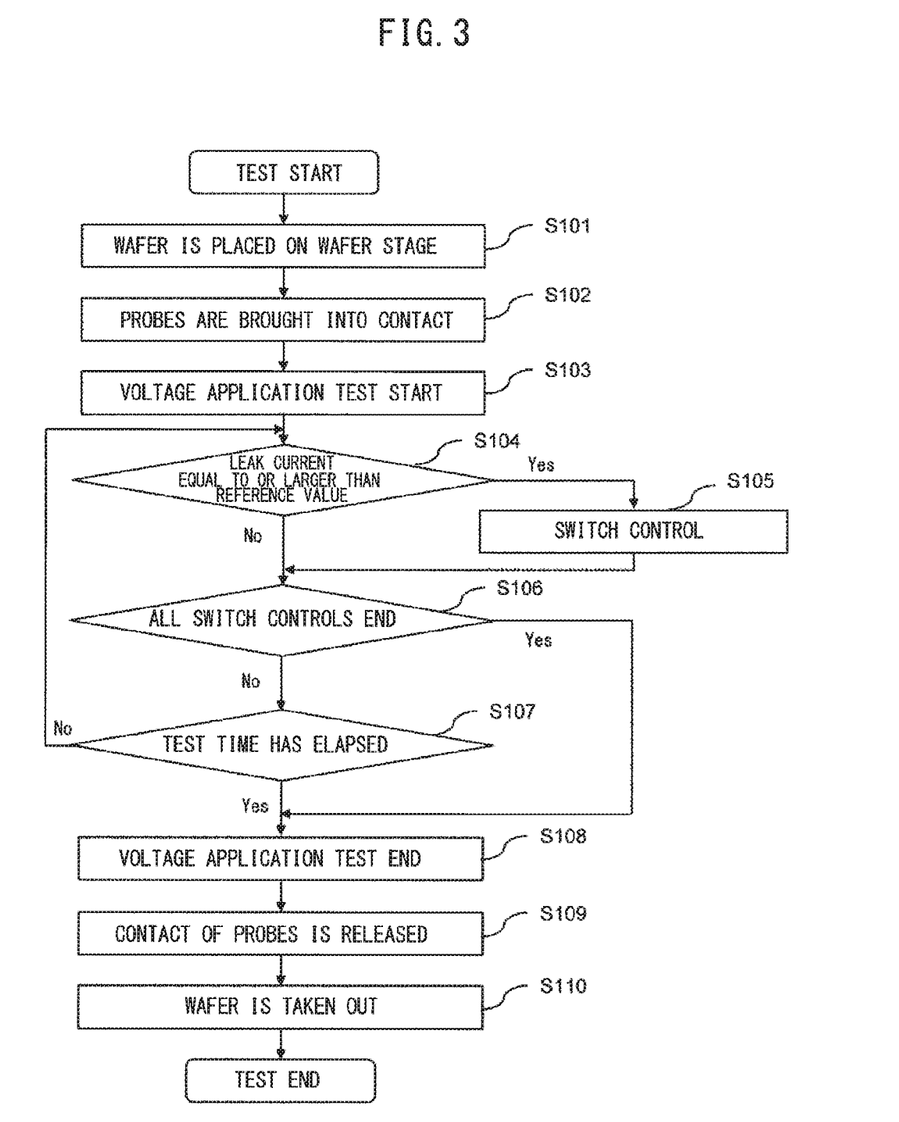
FIG. 3 is a flowchart for explaining a test method using the semiconductor test apparatus according to a first embodiment.
Figure 4:
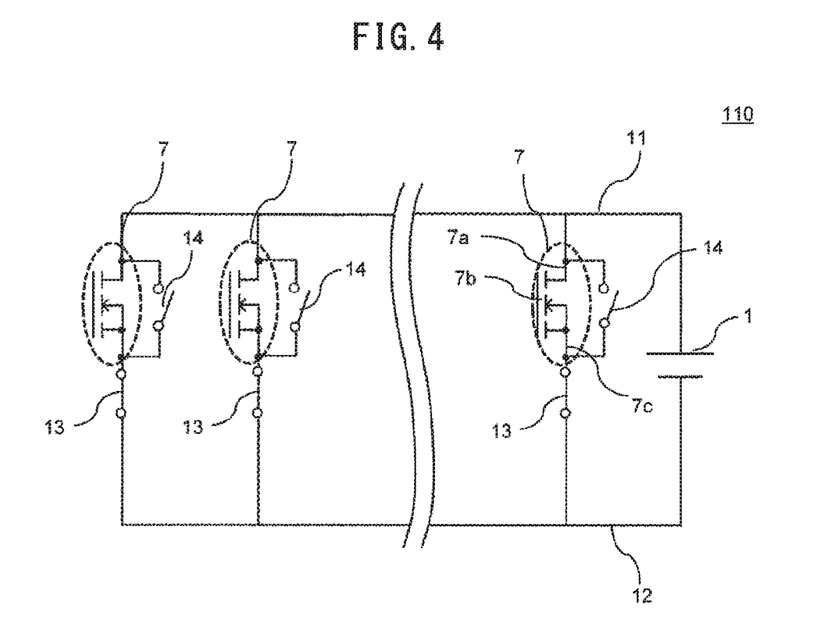
FIG. 4 is a circuit diagram illustrating the test circuit at the time of a test start of the semiconductor test apparatus according to a first embodiment.
Figure 5:
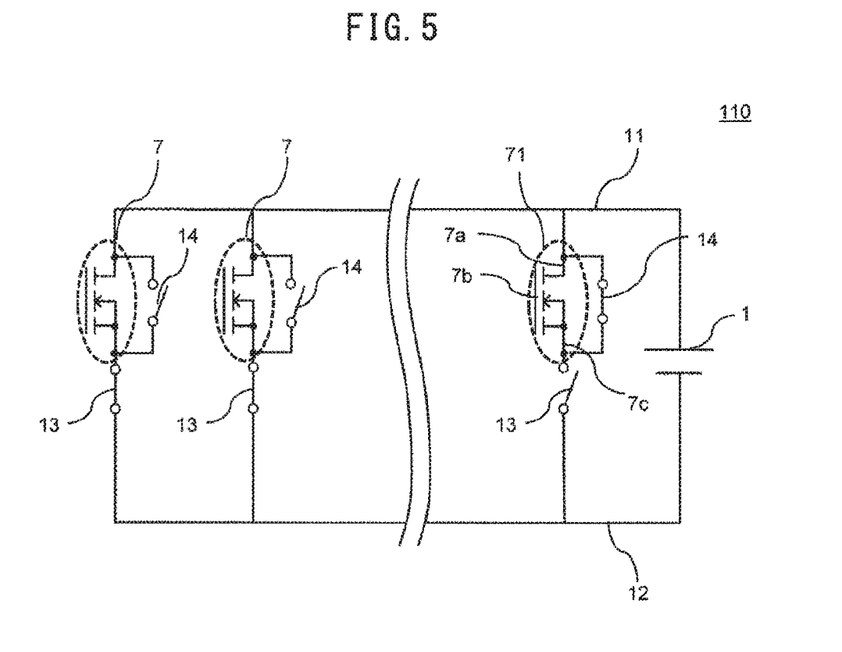
FIG. 5 is a circuit diagram illustrating an example of the test circuit after the test start of the semiconductor test apparatus according to a first embodiment.

A semiconductor test apparatus according to a first embodiment is explained with reference to FIGS. 1 to 5. FIG. 1 is a schematic diagram illustrating a semiconductor test apparatus 100 according to this embodiment. FIG. 2 is a circuit diagram illustrating a test circuit 110 of the semiconductor test apparatus 100. FIG. 3 is a flowchart for explaining a test method using the semiconductor test apparatus 100. FIG. 4 is a circuit diagram illustrating the test circuit 110 at the time of a test start. FIG. 5 is a circuit diagram illustrating an example of the test circuit 110 after the test start.

First, the configuration of the semiconductor test apparatus 100 is explained with reference to FIG. 1.

The semiconductor test apparatus 100 includes a power supply 1, a wafer stage 2 connected to a high-voltage side of the power supply 1, a plurality of probes 3 electrically independent from one another, a probe card 4 holding the probes 3 and connected to a low-voltage side of the power supply 1, and a control unit 5 including a switch and a control circuit 5a on the inside. The probes 3 are also electrically connected to the high-voltage side of the power supply 1 via the control unit 5. A semiconductor wafer 6 and semiconductor devices 7 formed on the semiconductor wafer 6 are objects to be tested and are not included in the configuration of the semiconductor test apparatus 100. A part of components is omitted in FIG. 1. However, the semiconductor test apparatus 100 is configured to include the test circuit 110 illustrated in FIG. 2. FIG. 2 is explained below.

In the following explanation, as an example, a test target of the semiconductor test apparatus 100 is a vertical SiC-MOSFET (Metal Oxide Semiconductor Field Effect Transistor). The example is explained in detail below.

The semiconductor device 7, which is the object to be tested, is a vertical SIC-MOSFET including a drain electrode 7a (a high-voltage terminal), a gate electrode 7b, and a source electrode 7c (a low-voltage terminal) as illustrated in a dotted-line frame in FIG. 2. In FIG. 1, the drain electrode 7a, the gate electrode 7b, and the source electrode 7c are not illustrated. However, a plurality of drain electrodes 7a of a plurality of semiconductor devices 7 are respectively formed in the plurality of semiconductor devices 7 on the rear surface side of the semiconductor wafer 6, that is, on the wafer stage 2 side. A plurality of gate electrodes 7b and a plurality of source electrodes 7c of the semiconductor devices 7 are respectively formed independently from one another in the plurality of semiconductor devices 7 on the front surface side of the semiconductor wafer 6, that is, the probes 3 side.

The wafer stage 2 is a conductive stage for placing the semiconductor wafer 6. The wafer stage 2 is electrically connected to the high-voltage side of the power supply 1 via the control unit 5 using a high-voltage wire 11. In other words, the semiconductor wafer 6 is placed on the wafer stage 2 such that the drain electrodes 7a formed on the lower surface side of the semiconductor wafer 6 come into contact with the wafer stage 2. Consequently, the wafer stage 2 electrically connects the drain electrodes 7a of the semiconductor devices 7 and the high-voltage side of the power supply 1. At this time, since the drain electrodes 7a are respectively formed on the rear surface side of the semiconductor wafer 6, the drain electrodes 7a of the plurality of semiconductor devices 7 are electrically connected to the high-voltage side of the power supply 1 in common via the wafer stage 2.

The probes 3 are a plurality of terminals held by the probe card 4 and independent from one another. The probes 3 are connected independently from one another to the source electrodes 7c formed on the upper surface side of the semiconductor wafer 6. The probes 3 are electrically connected to the low-voltage side of the power supply 1 via the probe Card 4 and the control unit 5 using a low-voltage wire 12. In other words, the probes 3 are brought into contact with the source electrodes 7c of the semiconductor devices 7 to electrically connect the source electrodes 7c of the semiconductor devices 7 and the low-voltage side of the power supply 1. The source electrodes 7c are respectively formed independently from one another in the plurality of semiconductor devices 7. The respective source electrodes 7c are electrically connected to the low-voltage side of the power supply 1 via the plurality of probes 3. In FIG. 1, the low-voltage wire 12 connected to the control unit 5 from the probes 3 via the probe card 4 is simplified and illustrated. However, a plurality of wires independent from one another connected to a plurality of terminals are used as the low-voltage wire 12. The probes 3 are also electrically connected to the high-voltage side of the power supply 1 via the control unit 5.

In this way, the drain electrodes 7a formed on the lower surface side of the semiconductor wafer 6 and the source electrodes 7c formed on the upper surface side of the semiconductor wafer 6 are respectively electrically connected to the power supply 1 using the wafer stage 2 and the probes 3. Consequently, the semiconductor test apparatus 100 can simultaneously apply voltage between drains and sources of the plurality of semiconductor devices 7 and perform the burn-in test.

The probe card 4 holds the probes 3 as explained above. The probe card 4 is configured to be detachable from the semiconductor test apparatus 100 together with the probes 3. Since the probe card 4 is detachable, the probe card 4 can be replaced with various different probe cards according to test targets and purposes. The probe card 4 may include circuit components such as a power supply and a switch according to necessity inside.

In order to control the test circuit of the semiconductor test apparatus 100, the control unit 5 is provided to be connected to the high-voltage wire 11 connected to the high-voltage side of the power supply 1 and the low-voltage wire 12 connected to the low-voltage side of the power supply 1. The control unit 5 includes, as internal components thereof, the control circuit 5a, a plurality of circuit-breaking switches 13 (first switches) illustrated in the test circuit 110 in FIG. 2, and a plurality of drain-source switches 14 (second switches). Details of the circuit-breaking switches 13 and the drain-source switches 14 are explained below in explanation about the test circuit 110. The control unit 5 may further include a voltage detection circuit (not illustrated) that measures voltage between shunt resistors.

The semiconductor test apparatus 100 further includes a leak current detection circuit (not illustrated) for measuring a leak current during voltage application for the purpose of detecting a deficiency and deterioration of the semiconductor device 7.

The test circuit 110 of the semiconductor test apparatus 100 is explained with reference to FIG. 2.

The test circuit 110 includes the high-voltage wire 11 connected to the high-voltage side of the power supply 1, the low-voltage wire 12 connected to the low-voltage side of the power supply 1, the circuit-breaking switches 13 (the first switches) connected to the source electrodes 7c side of the semiconductor devices 7, which are objects to be tested, and the drain-source switches 14 (the second switches) connected between drains and sources of the semiconductor devices 7. All of those illustrated in dotted-line frames in FIG. 2 are the semiconductor devices 7, which are the objects to be tested. The semiconductor devices 7 are not included in the configuration of the semiconductor test apparatus 100.

As illustrated in FIG. 2, in the test circuit 110 of the semiconductor test apparatus 100, the plurality of semiconductor devices 7 are connected in parallel. Consequently, it is possible to simultaneously apply voltage between the drains and the sources of the respective semiconductor devices 7 and simultaneously test the plurality of semiconductor devices 7.

The high-voltage wire 11 electrically connects the high-voltage side of the power supply 1 and the drain electrodes 7a (the high-voltage terminals) of the semiconductor devices 7. The low-voltage wire 12 electrically connects the low-voltage side of the power supply 1 and the source electrodes 7c (the low-voltage terminals) of the semiconductor devices 7. Since the semiconductor test apparatus 100 is connected to the semiconductor devices 7 in this way, voltage can be applied between the drain electrodes 7a and the source electrodes 7c of the semiconductor devices 7.

The circuit-breaking switches 13 (the first switches) are a plurality of switches connected to the respective semiconductor devices 7 between the source electrodes 7c and the low-voltage side of the power supply 1. By turning off the circuit-breaking switches 13, the semiconductor devices 7 connected to the turned-off circuit-breaking switches 13 are disconnected from the test circuits. As components of the semiconductor test apparatus 100, the circuit-breaking switches 13 are included in the control unit 5 illustrated in FIG. 1.

The drain-source switches 14 (the second switches) are switches, one ends of which are connected to the drain electrodes 7a of the respective semiconductor devices 7 and the other ends of which are connected to the source electrodes 7c of the respective semiconductor devices 7. By turning on the drain-source switches 14, the potential of the source electrodes 7c on the low-voltage side is raised to the potential of the drain electrodes 7a on the high-voltage side. As components of the semiconductor test apparatus 100, the drain-source switches 14 are included in the control unit 5 illustrated in FIG. 1.

In the burn-in test, when voltage application between the drain electrodes 7a and the source electrodes 7c of the semiconductor devices 7 is started, the circuit-breaking switches 13 are controlled to on and the drain-source switches 14 are controlled to off in all the semiconductor devices 7, which are measurement targets. If there is a semiconductor device, a deficiency of which is already known at this time, the circuit-breaking switch 13 may be controlled to off and the drain-source switch 14 may be controlled to on in the semiconductor device at the start of the voltage application.

After controlling the switches in this way to start the voltage application, when detecting a leak current equal to or larger than a reference value set in advance in a part of the plurality of semiconductor devices 7, which are the objects to be tested, the control circuit 5a determines the semiconductor device as a defective semiconductor device. The control circuit 5a controls only the circuit-breaking switch 13 and the drain-source switch 14 connected to the defective semiconductor device. First, the control circuit 5a controls the circuit-breaking switch 13 to off and thereafter controls drain-source switch 14 to on. The defective semiconductor device can be disconnected from the test circuit by turning off the circuit-breaking switch 13. The potential of the source electrode 7c is raised to the potential of the drain electrode 7a by thereafter turning on the drain-source switch 14. Therefore, voltage application to the defective semiconductor device, for which the test should be suspended, can be stably suppressed. Consequently, it is possible to continue the test without affecting the other semiconductor devices.

A test method of testing semiconductor devices using the semiconductor test apparatus 100 is explained with reference to FIG. 3.

First, the semiconductor wafer 6 is placed on the wafer stage 2 such that the lower surface side of the semiconductor wafer 6 comes into contact with the wafer stage 2 (step S101). Position adjustment for the semiconductor wafer 6 is performed according to necessity to bring the drain electrodes 7a formed on the lower surface side of the semiconductor wafer 6 into contact with the wafer stage 2. Consequently, the high-voltage side of the power supply 1 and the drain electrodes 7a (the high-voltage terminals) of the semiconductor devices 7 are electrically connected.

Subsequently, the probes 3 are brought into contact with the plurality of source electrodes 7c formed on the upper surface side of the semiconductor wafer 6 (step S102). Consequently, the low-voltage side of the power supply 1 and the source electrodes 7c (the low-voltage terminals) of the semiconductor devices 7 are electrically connected. The probes 3 may be connected to the source electrode 7c of a part of the plurality of semiconductor devices 7 formed on the semiconductor wafer 6 or may be connected to the source electrodes 7c of all the semiconductor devices 7.

After the drain electrodes 7a and the source electrodes 7c are respectively electrically connected to the power supply 1 in this way, a voltage application test is started (step S103). At this time, voltage is applied between the drain electrodes 7a and the source electrodes 7c of the plurality of semiconductor devices 7 from the power supply 1 via the wafer stage 2 connected to the high-voltage wire 11 and the probes 3 connected to the low-voltage wire 12. When the voltage application is started, as illustrated in FIG. 4, the circuit-breaking switches 13 (the first switches) are controlled to on and the drain-source switches 14 (the second switches) are controlled to off. The voltage application test may be performed at the room temperature or may be performed under high temperature in a range allowed by the semiconductor test apparatus 100.

When the voltage application test is started, the leak current detection circuit determines whether a leak current equal to or larger than the reference value set in advance is detected in any one of the plurality of test target semiconductor devices 7 (step S104).

When a leak current equal to or larger than the reference value is detected in any one of the semiconductor devices 7 (Yes in step S104), the control circuit 5a determines that the semiconductor device as a defective semiconductor device. First, the control circuit 5a controls the circuit-breaking switch 13 connected to the defective semiconductor device to off and subsequently controls the drain-source switch 14 connected to the defective semiconductor device to on, respectively (step S105). For example, when a leak current equal to or larger than the reference value is detected in the semiconductor device 7 at the right end in the test circuit 110 at the time of the test start illustrated in FIG. 4, as illustrated in FIG. 5, the control circuit 5a determines a semiconductor device 71 as a defective semiconductor device. The control circuit 5a controls the drain-source switch 14 and the circuit-breaking switch 13 connected to the defective semiconductor device 71. First, the control circuit 5a controls the circuit-breaking switch 13 to off and thereafter controls the drain-source switch 14 to on. When the circuit-breaking switch 13 is turned off first in this way, the defective semiconductor device 71 is disconnected from the test circuit. When the drain-source switch 14 is turned on thereafter, the potential of the source electrode 7c is raised to the potential of the drain electrode 7a. Consequently, the potential of the defective semiconductor device 71 can be stabilized. At this time, the voltage application is continued for the other semiconductor devices 7.

When a leak current equal to or larger than the reference value is not detected in all the semiconductor devices 7 (No in step S104) or after the switch control is performed as explained above in step S105, subsequently, the control circuit 5a determines whether all the test target semiconductor devices 7 are determined as defective semiconductor devices, that is, the switch control in step S105 is performed on all the test target semiconductor devices 7 (step S106).

When the switch control in step S105 is performed on all the semiconductor devices 7, that is, the circuit-breaking switches 13 are controlled to off and the drain-source switches 14 are controlled to on, respectively (Yes in step S106), all the semiconductor devices 7 are disconnected from the test circuit. Voltage is applied to none of the semiconductor devices 7. Therefore, the control circuit 5a proceeds to step S108, suspends the voltage application, and ends the test.

On the other hand, when the switch control in step S105 is performed on not all of the semiconductor devices 7, that is, when the semiconductor device 7 to which voltage is being applied is present (No in step S106), the semiconductor test apparatus 100 determines whether a fixed test time has elapsed (step S107). The test time is decided in advance.

When it is determined that the test time has not elapsed (No in step S107), the control circuit 5a returns to step S104 and continues the detection by leak current detection circuit.

On the other hand, when it is determined that the fixed test time has elapsed (Yes in step S106), the control circuit 5a ends the voltage application test (step S108).

After the voltage application test ends, the control circuit 5a releases the contact of the probes 3 set in contact with the source electrode 7c (step S109).

Finally, the measurement target semiconductor wafer 6 placed on the wafer stage 2 is taken out from the apparatus and the test ends (step S110).

By performing the burn-in test using the semiconductor test apparatus 100 as explained above, it is possible to apply positive voltage between the drains and the sources of the plurality of semiconductor devices 7 and sort a semiconductor device including a large number of crystal defects and having relatively short device life as a defective product. It is possible to secure reliability of semiconductor devices.

Characteristic check for the semiconductor devices may be performed between step S102 and step S103, that is, before the voltage application test start and between step S107 and step S108, that is, after the voltage application test end. In particular, by performing the characteristic check before the voltage application test start, in the semiconductor device 7 in which a deficiency is found, it is possible to turn off the circuit-breaking switch 13 and turn on the drain-source switch 14 in advance and disconnect the semiconductor device from the test circuit to prevent voltage from being applied to the semiconductor device.

Effects of the semiconductor test apparatus 100 configured in this way are explained.

In the conventional semiconductor test apparatus, when voltage is simultaneously applied to a plurality of semiconductor devices to perform the burn-in test, a test time is sometimes long in the burn-in test. Therefore, if a deficiency occurs and a leak current occurs in a part of the semiconductor devices, the test circuit is short-circuited and the power supply is turned off when the voltage application is continued thereafter. There is a problem that the test cannot be continued for the other semiconductor devices having good device characteristics. On the other hand, in the semiconductor test apparatus in this embodiment, there is an effect that, when a test is performed on a large number of semiconductor devices, the test can be simultaneously performed on a plurality of semiconductor devices and can be continued to the last even if a deficiency occurs in a part of the semiconductor devise.

That is, in the configuration of the semiconductor test apparatus 100 in this embodiment, the circuit-breaking switches 13 and the drain-source switches 14 are provided in the test circuit 110. Therefore, there is an effect that, when a leak current equal to or larger than the reference value is detected in a part of the semiconductor devices, the semiconductor device can be determined as a defective semiconductor device and disconnected from the test circuit, and the potential of the semiconductor device can be stabilized and it is possible to continue the test without affecting the remaining semiconductor devices having good device characteristics.

Figure 6:
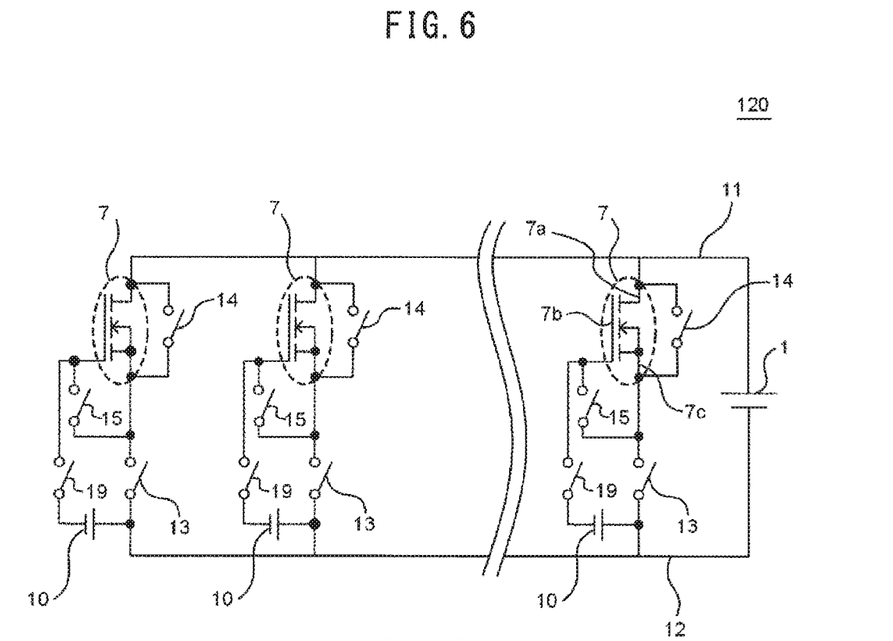
FIG. 6 is a circuit diagram illustrating a test circuit of a modification of the semiconductor test apparatus according to the first embodiment.

A modification of the semiconductor test apparatus in the first embodiment is explained with reference to FIG. 6. FIG. 6 is a circuit diagram illustrating a test circuit 120 obtained by modifying the test circuit 110 of the semiconductor test apparatus 100 in this embodiment.

First, the test circuit 120 is explained with reference to FIG. 6.

The test circuit 120 is different from the test circuit 110 in the first embodiment in that the test circuit 120 includes a plurality of power supplies 10 for applying voltage between gates and sources in addition to between drains and sources and further includes, between the gate electrodes 7b and the source electrodes 7c, gate-source switches 15 (fourth switches) connected in parallel to the power supplies 10 and gate-source shut-off switches 19 (fifth switches) connected in series to the power supplies 10.

When voltage is applied between the gates and the sources of the semiconductor devices 7 as well, the probes 3 explained with reference to FIG. 1 are respectively independently set in contact with the gate electrodes 7b of the semiconductor devices 7. The power supplies 10 are respectively connected between the gate electrodes 7b and the source electrodes 7c. As the configuration of the test circuit 120, as illustrated in FIG. 6, it is desirable to connect the high-voltage side of the power supplies 10 to the source electrodes 7c side and connect the low-voltage side of the power supplies 10 to the gate electrodes 7b side.

The gate-source switches 15 (the fourth switches) are switches connected to the gate electrodes 7b and the source electrodes 7c of the respective semiconductor devices 7 in parallel to the power supplies 10. In the burn-in test, when voltage is applied between the gate electrodes 7b and the source electrodes 7c as well, the gate-source switches 15 are turned off at the time of the voltage application start. After the test is started, when a leak current equal to or larger than the reference value is detected in a part of the plurality of test target semiconductor devices 7, the control circuit 5a controls the drain-source switches 14 and the gate-source switches 15 to on simultaneously. Consequently, it is possible to raise the potential of the source electrodes 7c to the potential of the gate electrodes 7b.

The gate-source shut-off switches 19 (the fifth switches) are switches connected to the gate electrodes 7b and the source electrodes 7c of the respective semiconductor devices 7 in series to the power supplies 10. In the burn-in test, when voltage is applied between the gate electrodes 7b and the source electrodes 7c as well, the gate-source shut-off switches 19 are turned on at the time of the voltage application start. After the test is started, when a leak current equal to or larger than the reference value is detected in a part of the plurality of test target semiconductor devices 7, the control circuit 5a controls the circuit-breaking switch 13 to off and, at the same time, controls the gate-source shut-off switch 19 to off. Consequently, it is possible to shut off voltage application between the gate and the source and disconnect the semiconductor device 7 from the test circuit.

By applying positive voltage between the drains and the sources of the semiconductor devices 7 and applying negative voltage between the gates and the sources in this way, it is possible to perform the test on a MOSFET having a low threshold voltage.

A test method of testing semiconductor devices using a semiconductor test apparatus including the test circuit 120 is explained centering on differences from the semiconductor test apparatus 100 including the test circuit 110.

In the test method of testing semiconductor devices using the semiconductor test apparatus including the test circuit 120, step S103 and step S105 are partially different from the steps in the test method of the semiconductor test apparatus 100 explained with reference to FIG. 3. The other steps are the same.

In step S103, at the time of the voltage application start, the circuit-breaking switches 13 are controlled to on and the drain-source switches 14 are controlled to off. In addition, the gate-source shut-off switches 19 are controlled to on and the gate-source switches 15 are controlled to off, respectively.

In step S105, first, the control circuit 5a controls the circuit-breaking switches 13 to off. At the same time, the control circuit 5a controls the gate-source shut-off switches 19 to off as well. Thereafter, the control circuit 5a controls the drain-source switches 14 to on. At the same time, the control circuit 5a controls the gate-source switches 15 to on as well. Consequently, after a defective semiconductor device is disconnected from the test circuit, the potential between the drain and the source and between the gate and the source can be set to the same potential. Therefore, the potential of the defective semiconductor device disconnected from the test circuit stabilizes. It is possible to continue the test without affecting the other semiconductor devices.

In particular, when the burn-in test of a SiC-MOSFET is performed, a test for applying positive voltage between the drain and the source and, at the same time, applying negative voltage between the gate and the source is effective. Therefore, in such a case, there is a peculiar effect that, by providing the circuit-breaking switch 13, the drain-source switch 14, and the gate-source switch 15, a defective semiconductor device in which a leak current equal to or larger than the reference value is detected can be stably disconnected from the test circuit and it is possible to continue the test of the remaining semiconductor devices having good device characteristics.

In this embodiment, as an example of the semiconductor device 7, which is the object to be tested, the SiC-MOSFET including terminals of the drain electrode 7a, the gate electrode 7b, and the source electrode 7c is explained. However, the semiconductor device 7 is not limited to this. When a Si-MOSFET, an IGBT (Insulated Gate Bipolar Transistor), or the like is tested, the same effect is obtained by providing, in a test circuit thereof, switches equivalent to the circuit-breaking switch 13 (the first switch), the drain-source switch 14 (the second switch), and the gate-source switch 15 (the fourth switch).

In this embodiment, the semiconductor wafer 6 is the test target of the semiconductor test apparatus 100. However, not only this, but, for example, an alligator wire may be used as the wafer stage 2 or the probes 3 if the semiconductor test apparatus 100 is a semiconductor test apparatus including the test circuit 110 illustrated in FIG. 2 or the test circuit 120 illustrated in FIG. 6. In this case, the test target is not limited to the semiconductor wafer. A plurality of independent semiconductor devices, a plurality of semiconductor modules, or the like may be the test target. The same applies to the other embodiments.

Second Embodiment

Figure 7:
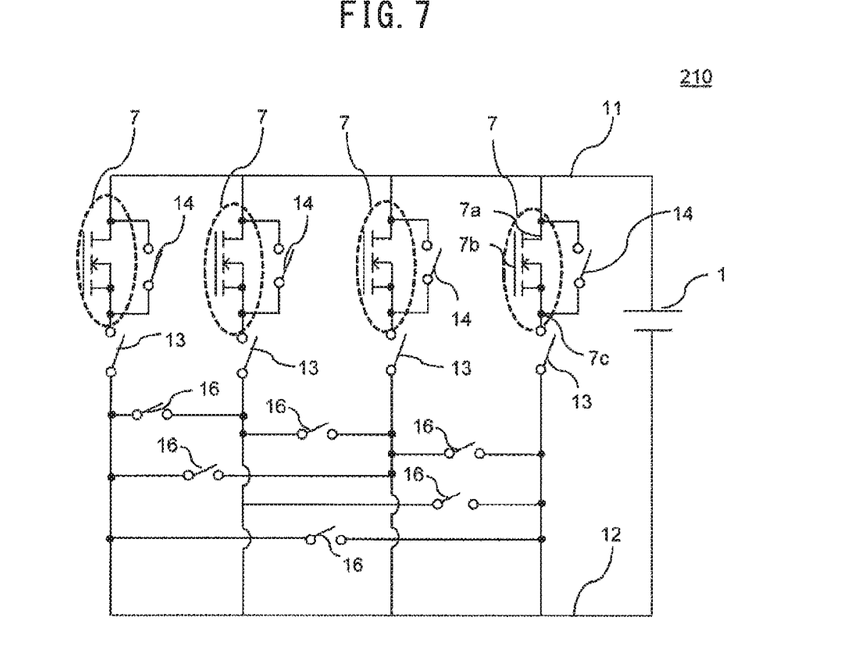
FIG. 7 is a circuit diagram illustrating a test circuit of a semiconductor test apparatus according to a second embodiment.
Figure 8:
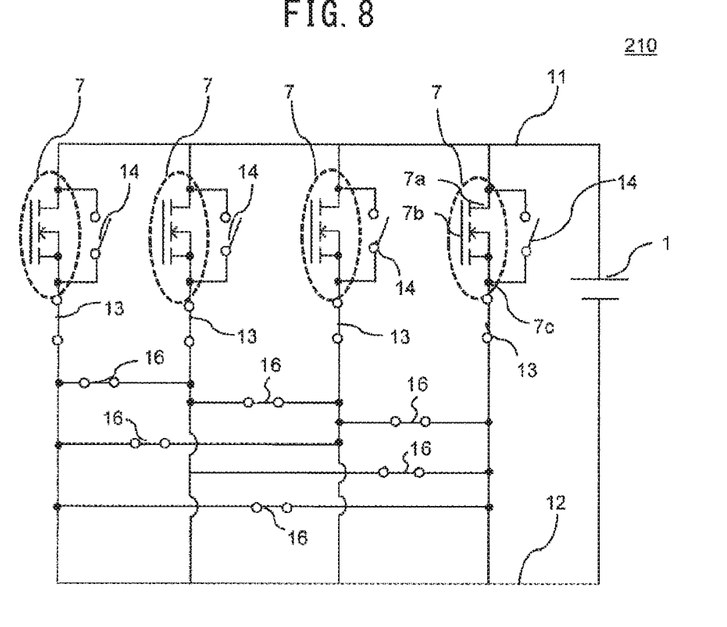
FIG. 8 is a circuit diagram illustrating the test circuit at the time of a test start of the semiconductor test apparatus according to the second embodiment.
Figure 9:
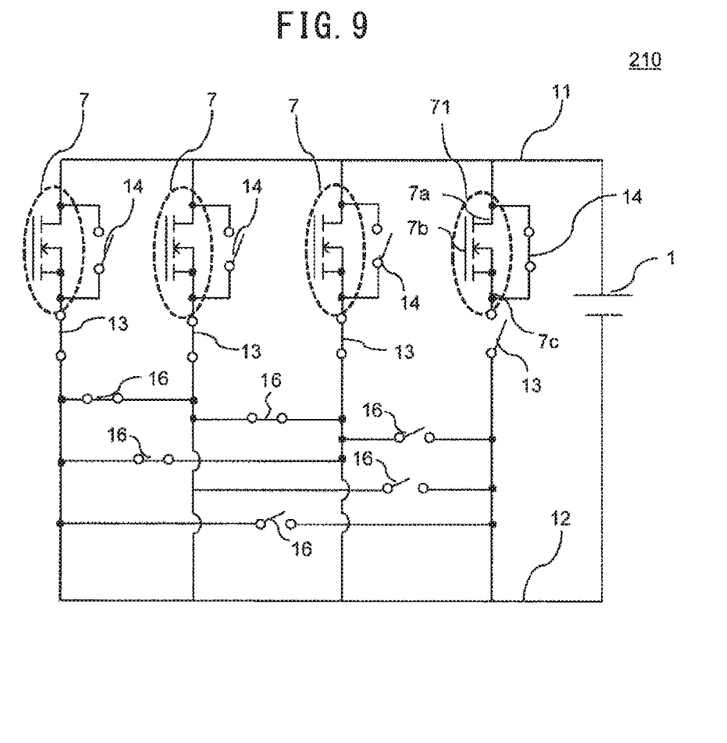
FIG. 9 is a circuit diagram illustrating an example of the test circuit after the test start of the semiconductor test apparatus according to the second embodiment.

A semiconductor test apparatus in a second embodiment is explained with reference to FIGS. 7 to 9. FIG. 7 is a circuit diagram illustrating a test circuit 210 of the semiconductor test apparatus in this embodiment. FIG. 8 is a circuit diagram illustrating the test circuit 210 at the time of a test start. FIG. 9 is a circuit diagram illustrating an example of the test circuit 210 after the test start.

First, the test circuit 210 is explained with reference to FIG. 7.

The test circuit 210 of the semiconductor test apparatus in this embodiment is different from the test circuit 110 of the semiconductor test apparatus 100 in the first embodiment in that, as illustrated in FIG. 7, the test circuit 210 includes inter-source connection switches 16 (third switches) for electrically turning on or off between the source electrodes 7c (the low-voltage terminals) of the plurality of semiconductor devices 7. The other components of the semiconductor test apparatus in this embodiment are the same as the components of the semiconductor test apparatus 100 in the first embodiment. Therefore, a schematic diagram and explanation of the semiconductor test apparatus are omitted.

As illustrated in FIG. 7, the inter-source connection switches 16 (the third switches) are provided such that the source electrode 7c of each of the semiconductor devices 7 can be turned on or off independently from the source electrodes 7c of all the other semiconductor devices 7.

In FIG. 7, four semiconductor devices 7 are connected in parallel and tested. Six inter-source connection switches 16 and six wires therefor are used. Consequently, each of all the semiconductor devices 7 is connected to the other semiconductor devices 7 via the inter-source connection switches 16. Similarly, when N semiconductor devices 7 are connected in parallel, (1+2+ . . . +(N−1)) inter-source connection switches 16 and (1+2+, . . . +(N−1)) wires therefor are provided. Consequently, each of the N semiconductor devices 7 can be independently connected to all the other semiconductor devices 7 via the inter-source connection switches 16. By providing the plurality of inter-source connection switches 16 to be connected among the respective semiconductor devices 7, even if a deficiency occurs in any semiconductor device 7, it is possible to disconnect only a defective semiconductor device while keeping the source electrodes 7c connected in the other semiconductor devices 7.

In the test by the test circuit 210, as in the first embodiment, the test is performed by applying voltage between the drains and the sources of the plurality of semiconductor devices 7 from the power supply 1 via the high-voltage wire 11 and the low-voltage wire 12. In that case, by turning on all the inter-source connection switches 16, source potential of the test targets can be set common during the test. Consequently, it is possible to stabilize noise that occurs during the test. The control circuit 5a included in the control unit 5 may perform the control of the inter-source connection switches 16. An IC for control (not illustrated) provided separately may be used for the control.

A test method of testing semiconductor devices using the semiconductor test apparatus in this embodiment is explained with reference to FIGS. 8 and 9.

In the test method of testing semiconductor devices using the semiconductor test apparatus in this embodiment, step S103 and step S105 are partially different from the steps of the test method of the semiconductor test apparatus 100 explained with reference to FIG. 3 in the first embodiment. The other steps of the test method of testing semiconductor devices using the semiconductor test apparatus in this embodiment are the same as the steps of the test method of the semiconductor test apparatus 100 in the first embodiment. Therefore, explanation of the steps is omitted.

Step S103 is a step of starting voltage application between the drains and the sources of the semiconductor devices 7. At the time of a voltage application start in the test in which the semiconductor test apparatus in this embodiment is used, as illustrate in FIG. 8, the drain-source switches 14 are controlled to off, the circuit-breaking switches 13 are controlled to on, and the inter-source connection switches 16 are controlled to on, respectively. By turning on the inter-source connection switches 16 in this way, the potential on the source electrodes 7c side of the respective semiconductor devices 7 can be set common. Therefore, the influence of a feeble leak current and noise can be suppressed. Thereafter, the control circuit 5a proceeds to step S104 and detects a leak current as in the first embodiment.

Step S105 is a step of controlling the switches of the semiconductor test apparatus when a leak current equal to or larger than the reference value is detected in step S104. The control circuit 5a controls all the inter-source connection switches 16 connecting a defective semiconductor device, in which the leak current equal to or larger than the reference value is detected, and the other semiconductor devices to off Thereafter, the control circuit 5a controls the circuit-breaking switch 13 connected to the defective semiconductor device to off and, thereafter, controls the drain-source switch 14 to on.

For example, when a leak current equal to or larger than the reference value is detected in the semiconductor device 7 at the right end in the test circuit illustrated in FIG. 8, as illustrated in FIG. 9, the control circuit 5a first determines the semiconductor device 71, in which the leak current equal to or larger than the reference value is detected, as a defective semiconductor device 71. The control circuit 5a controls all the inter-source connection switches 16 connected to the defective semiconductor device 71 to off, subsequently controls the circuit-breaking switch 13 to off; and thereafter controls the drain-source switch 14 to on. Consequently, after electrically turning off the source electrode 7c of the defective semiconductor device 71, in which the leak current is detected, and the source electrodes 7c of the other semiconductor devices 7, it is possible to disconnect the defective semiconductor device 71 from the test circuit and raise the potential of the source electrode 7c to the potential of the drain electrode 7a, In this way, the defective semiconductor device 71, in which the leak current is detected, can be disconnected from the test circuit after the connection on the source electrode 7c side is shut off. Therefore, it is possible to suppress noise due to changeover of the switches from affecting the other semiconductor devices 7 having good device characteristics. At this time, the voltage application is continued for the other semiconductor devices 7.

As a matter common to the explanation in the present disclosure, the test circuit is schematically illustrated in the drawings. Therefore, for example, in FIG. 9, the source electrode 7c of the semiconductor device 71, in which a leak current equal to or larger than the reference value is detected, and the source electrodes 7c of the other semiconductor devices 7 are kept connected by the low-voltage wire 12 even if the inter-source connection switches 16 are controlled to off. Actually, the low-voltage wire 12 connected to the power supply 1 is positioned far compared with the inter-source connection switches 16 and is long. Therefore, even if the source electrodes 7c are connected by the low-voltage wire 12, there is almost no influence of noise between the semiconductor device 71 and the other semiconductor devices 7. In other words, in the semiconductor test apparatus in this embodiment, since the inter-source connection switches 16 are provided near the source electrodes 7*c* of the semiconductor devices 7, it is possible to stabilize fluctuation in potential due to the influence of noise or the like between the semiconductor device 71 and the other semiconductor devices 7.

Effects of the semiconductor test apparatus in this embodiment configured as explained above are explained.

In the voltage application in the burn-in test, high voltage is applied or the test is performed under high temperature. Therefore, although the test target semiconductor device is not detected as a deficiency, a leak current or noise is likely to occur. In particular, when the test is performed on a semiconductor wafer on which a plurality of semiconductor devices are formed, the semiconductor devices are easily affected by noise or the like due to other semiconductor devices close to the semiconductor devices.

When a leak current equal to or larger than the reference value occurs in a part of the semiconductor devices during the voltage application in the burn-in test, the defective semiconductor device 71 can be disconnected from the test circuit by controlling the circuit-breaking switch 13. However, noise occurs, for example, during changeover of the switch. When the noise is transmitted to the other semiconductor devices, linked breakage or a deficiency is likely to occur in the semiconductor devices having good device characteristics.

Therefore, in the semiconductor test apparatus in this embodiment, by turning on the inter-source connection switches 16 and connecting the source electrodes 7*c* of the respective semiconductor devices 7 during the test, potential can be set common to the semiconductor devices 7. Therefore, there is a peculiar effect that the influence of noise during the test can be reduced.

When a leak current equal to or larger than the reference value is detected in a part of the semiconductor devices, first, all the inter-source connection switches 16 connected to the defective semiconductor device are controlled to off and, then, the circuit-breaking switch 13 and the drain-source switch 14 are controlled. Consequently, there is a peculiar effect that noise caused by changeover of the switches such as the circuit-breaking switch 13 or the drain-source switch 14 can be shut off, and, even if a part of the noise is propagated, the noise is stabilized by connection to the other semiconductor devices and damage to the semiconductor devices having good device characteristics can be suppressed.

Figure 10:
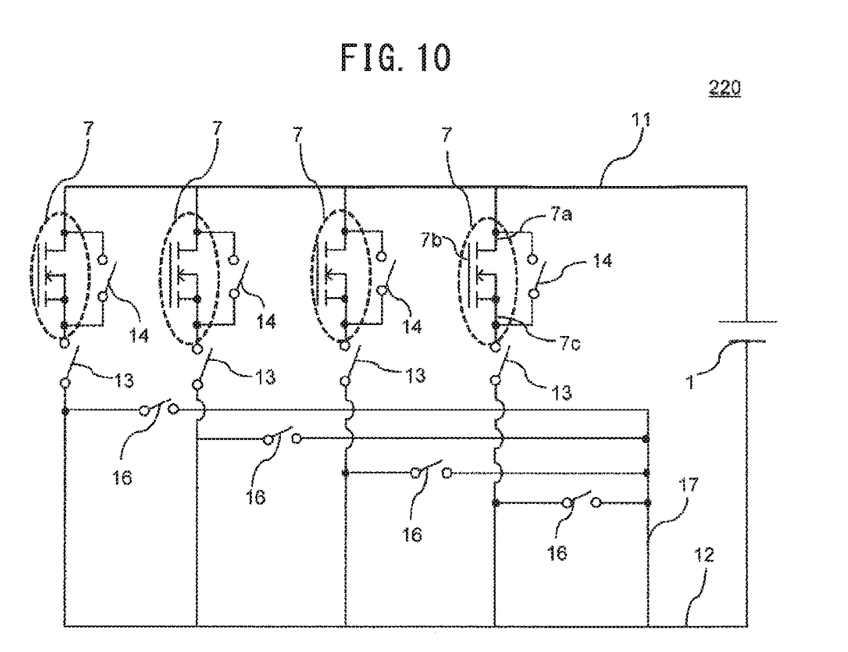
FIG. 10 is a circuit diagram illustrating a test circuit of a modification of the semiconductor test apparatus according to the second embodiment.

A modification of the semiconductor test apparatus in the second embodiment is explained with reference to FIG. 10. FIG. 10 is a circuit diagram illustrating a test circuit 220 obtained by modifying the test circuit 210 of the semiconductor test apparatus in this embodiment.

The test circuit 220 is different from the test circuit 210 in the second embodiment in that the test circuit 220 includes a switch connection wire 17 (a third switch connection wire) connected to the low-voltage side of the power supply 1 and the inter-source connection switches 16 connected to the source electrodes 7*c* side of the respective semiconductor devices 7 are connected to the switch connection wire 17 in common.

Usually, in order to electrically turn on or off the respective source electrodes 7*c* of the plurality of semiconductor devices 7 via the inter-source connection switches 16, as explained above, when the number of the semiconductor devices 7 is N, (1+2+ . . . +(N+1)) inter-source connection switches 16 are necessary. Therefore, by providing the switch connection wire 17, the inter-source connection switches 16 independently connected to the source electrodes 7*c* of the respective semiconductor devices 7 are connected to the switch connection wire 17 in common. Consequently, it is possible to independently electrically turn on or off the respective source electrodes 7*c*. There is a peculiar effect that the number of the inter-source connection switches 16 and the number of wires can be reduced to N.

Third Embodiment

Figure 11:
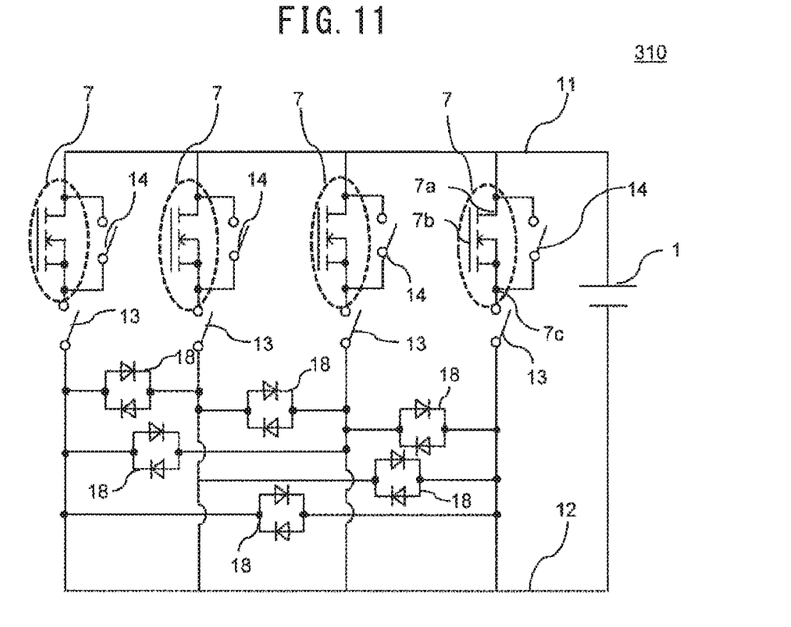
FIG. 11 is a circuit diagram illustrating a test circuit of a semiconductor test apparatus according to a third embodiment.

A semiconductor test apparatus in a third embodiment is explained with reference to FIG. 11. FIG. 11 is a circuit diagram illustrating a test circuit 310 of the semiconductor test apparatus in this embodiment.

First, the test circuit 310 is explained with reference to FIG. 11.

The test circuit 310 of the semiconductor test apparatus in this embodiment is different from the test circuit 110 of the semiconductor test apparatus 100 in the first embodiment in that, as illustrated in FIG. 11, the test circuit 310 includes bidirectional diodes 18 that electrically turn on or off the source electrodes 7*c* of the plurality of semiconductor devices 7. The other components of the semiconductor test apparatus in this embodiment are the same as the components of the semiconductor test apparatus 100 in the first embodiment. Therefore, a schematic diagram and explanation of the semiconductor test apparatus are omitted.

The bidirectional diodes 18 are provided in the same number and in the same positions as the inter-source connection switches 16 of the test circuit 210 in the second embodiment explained. In each of the bidirectional diodes 18, two diodes are connected in parallel to face opposite directions such that, when a potential difference equal to or larger than a fixed threshold occurs between both ends of the bidirectional diode 18, an electric current flows only in a direction of one of the ends. Accordingly, since the source electrodes 7*c* side of the respective semiconductor devices 7 is connected via the bidirectional diodes 18, when noise occurs on the source electrode 7*c* side of any one of the semiconductor devices 7, an electric current flows in a direction for cancelling the influence of the noise. When noise does not occur and a potential difference does not occur, the bidirectional diodes 18 are in an off state. Therefore, an electric current does not flow among the source electrodes 7*c*.

A test method of testing semiconductor devices using the semiconductor test apparatus in this embodiment is unrelated to the control of the bidirectional diodes 18. The test method is the same as the test method explained with reference to FIG. 3 in the first embodiment. Therefore, explanation of the test: method is omitted.

Effects of the semiconductor test apparatus in this embodiment configured as explained above are explained.

In the semiconductor test apparatus in this embodiment, since the bidirectional diodes 18 connected between the source electrodes 7*c* of the plurality of semiconductor devices 7 are provided, there is an effect that the potential among the source electrodes 7*c* of the respective semiconductor devices 7 can be kept common and the influence of noise during the test can be reduced. In particular, when the inter-source connection switches 16 explained in the second embodiment are used, the inter-source connection switches 16 need to be controlled. However, when the bidirectional diodes 18 are used, there is a peculiar effect that control of on/off of the switches is not necessary.

Like the test circuit 220 in the second embodiment illustrated in FIG. 10, the switch connection wire 17 (a bidirectional diode connection wire) y be applied to the test circuit 310 of the semiconductor test apparatus in this embodiment. In that case, as in the second embodiment, it is possible to reduce the numbers of the bidirectional diodes 18 and the wires.

Figure 12:
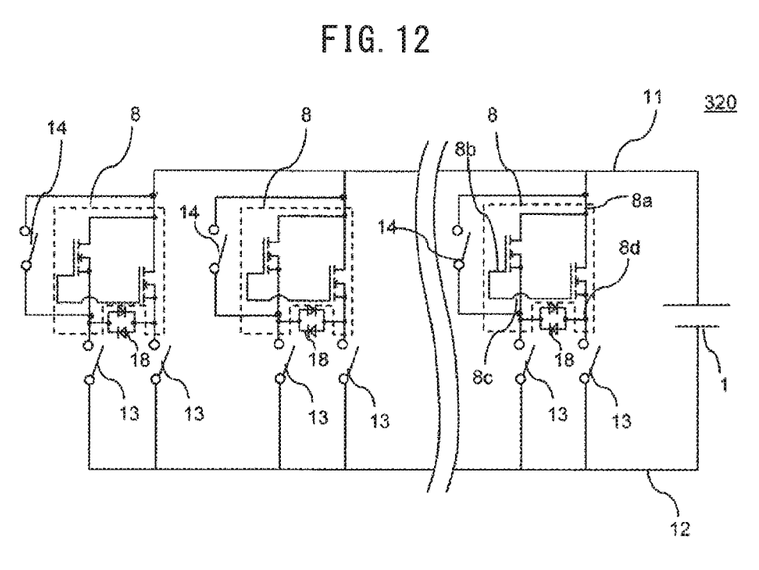
FIG. 12 is a circuit diagram illustrating a test circuit of an application example of the semiconductor test apparatus according to the third embodiment.

An application example of the semiconductor test apparatus in the third embodiment is explained with reference to FIG. 12. FIG. 12 is a circuit diagram illustrating a test circuit 320 to which the test circuit 310 of the semiconductor test apparatus in this embodiment is applied.

The test circuit 320 is, as illustrated in FIG. 12, an application example for applying the semiconductor test apparatus in this embodiment to semiconductor devices 8, which are MOSFETs incorporating current sense including a plurality of source electrodes in one semiconductor device. The semiconductor devices 8 are illustrated in dotted-line frames in FIG. 12. Since the semiconductor devices 8 are objects to be tested, the semiconductor devices 8 are not included in the configuration of the semiconductor test apparatus.

Each of the semiconductor devices 8 includes two types of source electrodes which are a main source electrode 8c and a sense source electrode 8d in addition to a drain electrode 8a and a gate electrode 8b. Main source electrodes 8c and sense source electrodes 8d are formed in the respective semiconductor devices 8.

In such semiconductor devices 8, when a plurality of semiconductor devices 8 are simultaneously tested and a deficiency such as a leak current occurs, the potential of the respective source electrodes is affected by noise. Usually, the capacitance of the sense source electrodes 8d is relatively smaller than the capacitance of the main source electrodes 8c, the capacitance of the sense source electrodes 8d is easily affected by noise. Breakage due to the noise is concerned.

Therefore, as illustrated in FIG. 12, the bidirectional diodes 18 are connected between the main source electrodes Sc and the sense source electrodes 8d. Consequently, as explained about the test circuit 310, there is a peculiar effect that the influence of the noise can be suppressed.

In the above explanation, the bidirectional diode 18 is connected between the main source electrode 8c and the sense source electrode 8d of the same semiconductor device 8 in the test circuit 320. Further, the inter-source connection switch 16 or the bidirectional diode 18 may be provided between source electrodes of different semiconductor devices 8.

Fourth Embodiment

Figure 13:
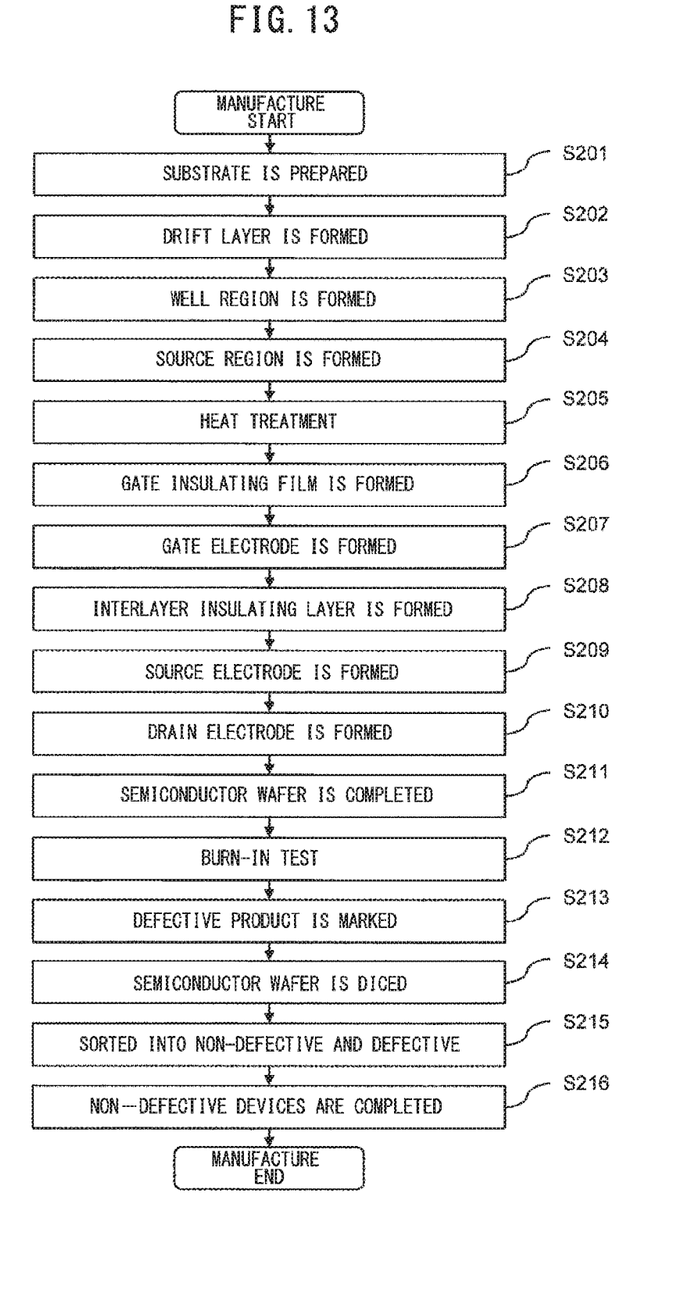
FIG. 13 is a flowchart for explaining the semiconductor device manufacturing method according to a fourth embodiment.

A fourth embodiment relates to a method of manufacturing a semiconductor device using the semiconductor test apparatus according to any one of the first to third embodiments. FIG. 13 is a flowchart for explaining the semiconductor device manufacturing method in this embodiment.

First, the semiconductor device manufacturing method in this embodiment is explained with reference to FIG. 13.

First, an n-type SiC substrate is prepared (step S201).

Subsequently, an n-type SiC drift layer is formed on the front surface of the SiC substrate by epitaxial growth (step S202).

A p-type well region containing aluminum (Al), which is a first impurity, as a p-type impurity is selectively formed on the formed SIC drift layer by ion injection (step S203).

An n-type source region containing nitrogen (N), which is a second impurity, as an n-type impurity is selectively formed on a surface layer section of the formed well region by ion injection (step S204).

Subsequently, heat treatment is performed to activate the impurities (step S205).

After the heat treatment, a gate insulating film made of silicon dioxide ($SiO_2$) is formed on the front surface side of the SiC drift layer including the well region and the source region excluding a part on the front surface side of the source region (step S206).

Further, a polysilicon film having electric conductivity is formed on the gate insulating film and a gate electrode is formed by patterning the polysilicon film (step S207).

Subsequently, an interlayer insulating layer is formed on the gate electrode (step S208).

Thereafter, a source electrode electrically connected to the source region is formed on the source region (step S209).

Subsequently, a drain electrode is formed on the rear surface of the SiC substrate (step S210).

In this way, a semiconductor wafer on which a plurality of semiconductor devices are formed is completed (step S211).

Subsequently, the semiconductor wafer is set in the semiconductor test apparatus in any one of the first to third embodiments and the burn-in test is performed (step S212). The test step is the same as the test method explained with reference to FIG. 3 in the first to third embodiments. Detailed explanation of the test step is omitted.

After the test ends, a semiconductor device determined as defective is marked (step S213).

Subsequently, an ineffective region in the wafer outer periphery is cut and a chip is diced (step S214).

After the semiconductor wafer is diced and the individual semiconductor devices are completed, the semiconductor devices determined as defective products are excluded, and the semiconductor devices are sorted into non-defective products and defective products (step S215).

In this way, non-defective semiconductor devices are completed (step S216).

As explained above, in the semiconductor device manufacturing method in this embodiment for manufacturing non-defective semiconductor devices, it is possible to connect the rear surface side of the semiconductor wafer 6 to the high-voltage side of the power supply 1 and connect the front surface side of the semiconductor wafer 6 to the low-voltage side of the power supply 1 to perform the test. Therefore, there is an effect that a plurality of vertical MOSFETs can be simultaneously measured at a point in time when the semiconductor wafer 6 is completed.

Further, in the semiconductor device test method in this embodiment, semiconductor devices are manufactured using the semiconductor test apparatuses in the first to third embodiments. Therefore, a plurality of semiconductor devices can be simultaneously tested. Furthermore, suspension of the test due to a deficiency of a part of the semiconductor devices can be prevented. Since this leads to a reduction in a test time, there is an effect that an entire manufacturing time for semiconductor devices can be reduced.

An application example of the semiconductor device manufacturing method in the fourth embodiment is explained.

In the semiconductor device manufacturing method in the fourth embodiment, the vertical SiC-MOSFET such as a planar type or a trench type is manufactured. However, the semiconductor device manufacturing method in the fourth embodiment can also be applied to a manufacturing method for manufacturing the MOSFET incorporating current sense explained in the application example of the third embodiment.

When the MOSFET incorporating current sense is manufactured, step S210 and step S213 among the manufacturing steps illustrated in FIG. 13 are mainly different. Explanation is omitted about the other manufacturing steps.

Step S210 is a step of forming a source electrode. In the case of the MOSFET incorporating current sense, two electrodes which are a main source electrode and a sense source electrode are included in one semiconductor device. Therefore, in the step of forming a source electrode, the main source electrode is provided in most of a source region and the sense source electrode is provided in a part of a region where the main source electrode is not provided. At this time, the main source electrode and the sense source electrode are independently provided.

Step S213 is a step of the burn-in test. As explained in the application example of the third embodiment, the burn-in test is performed by connecting a bidirectional diode between the main source electrode and the sense source electrode. Consequently, it is possible to prevent a situation in which the sense source electrode is affected by the main source electrode and a deficiency occurs in the sense source electrode or the sense source electrode is broken.

Appropriate combination, modification, and omission of the embodiments are included in the scope of the present disclosure.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No, 2019-179446, filed on Sep. 30, 2019 including specification, claims, drawings and summary, on which the convention priority of the present application is based, is incorporated herein by reference in its entirety.

The invention claimed is:

1. A semiconductor test apparatus comprising:
   a power supply;
   a high-voltage wire connecting high-voltage terminals of a plurality of semiconductor devices which are objects to be tested to a high-voltage side of the power supply;
   a low-voltage wire connecting low-voltage terminals of the semiconductor devices to a low-voltage side of the power supply;
   first switches connected in series to the semiconductor devices respectively, each of the first switches having one end connected to the low-voltage side of the power supply via the low-voltage wire and another end connected to the low-voltage terminal;
   second switches connected to the semiconductor devices respectively, each of the second switches having one end connected to the high-voltage terminal and another end connected to the low-voltage terminal; and
   a control circuit controlling the first switches and the second switches.

2. The semiconductor test apparatus according to claim 1, wherein the control circuit controls the first switches to on and controls the second switches to off at a time of a test start, and
   after the test start, the control circuit determines the semiconductor device in which a leak current equal to or larger than a reference value is detected as a defective semiconductor device, controls the first switch connected to the defective semiconductor device to off and thereafter controls the second switch connected to the defective semiconductor device to on.

3. The semiconductor test apparatus according to claim 2, further comprising a plurality of third switches connected to the low-voltage terminals of the semiconductor devices and electrically turning on or off between the low-voltage terminals.

4. The semiconductor test apparatus according to claim 3, wherein the control circuit controls the third switches to on at the time of the test start, and
   after the test start, the control circuit controls the third switch connected to the low-voltage terminal of the defective semiconductor device to off and thereafter controls the first switch connected to the defective semiconductor device to off.

5. The semiconductor test apparatus according to claim 3, further comprising a third switch connection wire connecting the plurality of third switches to the low-voltage side of the power supply,
   wherein one end of the third switches are independently connected to the low-voltage terminals of the semiconductor devices, and another ends of the third switches are connected to the third switch connection wire in common.

6. The semiconductor test apparatus according to claim 2, further comprising a plurality of bidirectional diodes connected to the low-voltage terminals of the semiconductor devices and electrically turning on or off between the low-voltage terminals.

7. The semiconductor test apparatus according to claim 6, further comprising a bidirectional diode connection wire connecting the plurality of bidirectional diodes to the low-voltage side of the power supply,
   wherein one end of the bidirectional diodes are independently connected to the low-voltage terminals of the semiconductor devices, and another end of the bidirectional diodes are connected to the bidirectional diode connection wire in common.

8. The semiconductor test apparatus according to claim 2, further comprising fourth switches,
   wherein the semiconductor devices are MOSFETs having a gate electrode, a drain electrode that is the high-voltage terminal, and a source electrode that is the low-voltage terminal, one end of the fourth switches are connected to the gate electrodes of the semiconductor devices respectively, and another end of the fourth switches are connected to the source electrodes of the semiconductor devices respectively.

9. The semiconductor test apparatus according to claim 8, wherein the control circuit controls the fourth switches to off at the time of the test start, and
   after the test start, the control circuit controls the second switch connected to the defective semiconductor device and the fourth switch connected to the defective semiconductor device to on simultaneously.

10. The semiconductor test apparatus according to claim 1, wherein the object to be tested is a semiconductor wafer including a plurality of MOSFETs,
   each of the MOSFETs has a gate electrode, a drain electrode that is the high-voltage terminal, and a source electrode that is the low-voltage terminal,
   the drain electrodes are formed on a rear surface side of the semiconductor wafer,
   the source electrodes and the gate electrodes are formed on a front surface side of the semiconductor wafer,
   the semiconductor test apparatus comprises a wafer stage, probes, a probe card, and a control unit,
   the wafer stage is connected to the high-voltage wire, when the semiconductor wafer is placed on the wafer stage such that a lower surface side of the semiconductor wafer comes into contact with the wafer stage, the wafer stage is electrically connected to the drain electrodes of the plurality of MOSFETs, the probes are provided opposite to the wafer stage, brought into contact with an upper surface side of the semiconductor wafer and independently connected to the source electrodes of the plurality of MOSFETs, the probe card is connected to the low-voltage wire and holds the probes, and the control unit is connected to the high-voltage wire and the low-voltage wire and includes the first switches, the second switches and the control circuit inside.

\* \* \* \* \*